United States Patent
Heller et al.

(10) Patent No.: US 10,167,191 B2
(45) Date of Patent: Jan. 1, 2019

(54) METHOD FOR MANUFACTURING A MICRO ELECTRO-MECHANICAL SYSTEM

(71) Applicant: Kionix, Inc., Ithaca, NY (US)

(72) Inventors: Martin Heller, Ithaca, NY (US); Jonah deWall, Ithaca, NY (US); Andrew Hocking, Ithaca, NY (US); Kristin Lynch, Ithaca, NY (US); Sangtae Park, Ithaca, NY (US)

(73) Assignee: KIONIX, INC., Ithaca, NY (US)

(*) Notice: Subject to any disclaimer, the term of this patent is extended or adjusted under 35 U.S.C. 154(b) by 0 days.

(21) Appl. No.: 15/685,957

(22) Filed: Aug. 24, 2017

(65) Prior Publication Data

US 2018/0282154 A1 Oct. 4, 2018

Related U.S. Application Data

(60) Provisional application No. 62/481,635, filed on Apr. 4, 2017.

(51) Int. Cl.
*B81C 1/00* (2006.01)
(52) U.S. Cl.
CPC .... *B81C 1/00269* (2013.01); *B81C 2201/013* (2013.01); *B81C 2201/0171* (2013.01);
(Continued)
(58) Field of Classification Search
CPC .......... B81C 1/00269; B81C 2201/013; B81C 2201/0171; B81C 2201/05; B81C 2201/0197; B81C 2203/0118
See application file for complete search history.

(56) References Cited

U.S. PATENT DOCUMENTS 5,693,574 A 12/1997 Schuster et al.
5,905,203 A * 5/1999 Flach ................. G01P 15/0802
73/514.32
(Continued)

FOREIGN PATENT DOCUMENTS

DE 102005042754 B4 9/2008
EP 1264330 B1 7/2003
(Continued)

OTHER PUBLICATIONS

Eichler et al., "Plasma Activation as a Pretreatment Tool for Low-Temperature Direct Wafer Bonding in Microsystem Technology," ECS Transactions, 50(7):265-276, (2012).
(Continued)

*Primary Examiner* — Karen Kusumakar
(74) *Attorney, Agent, or Firm* — Alston & Bird LLP

(57) ABSTRACT

A method of fabricating a semiconductor device, includes, in part, growing a first layer of oxide on a surface of a first semiconductor substrate, forming a layer of insulating material on the oxide layer, patterning and etching the insulating material and the first oxide layer to form a multitude of oxide-insulator structures and further to expose the surface of the semiconductor substrate, growing a second layer of oxide in the exposed surface of the semiconductor substrate, and removing the second layer of oxide thereby to form a cavity in which a MEMS device is formed. The process of growing oxide in the exposed surface of the cavity and removing this oxide may be repeated until the cavity depth reaches a predefined value. Optionally, a multitude of bump stops is formed in the cavity.

24 Claims, 11 Drawing Sheets

(52) U.S. Cl.
CPC .. *B81C 2201/0197* (2013.01); *B81C 2201/05* (2013.01); *B81C 2203/0118* (2013.01)

(56) References Cited

U.S. PATENT DOCUMENTS

| | | | |
|---|---|---|---|
| 6,245,636 B1* | 6/2001 | Maszara | H01L 21/76232 257/E21.549 |
| 6,403,485 B1 | 6/2002 | Quek et al. | |
| 7,144,750 B2 | 12/2006 | Ouellet et al. | |
| 7,442,570 B2 | 10/2008 | Nasiri et al. | |
| 8,237,296 B2 | 8/2012 | Hancer | |
| 8,592,926 B2 | 11/2013 | Montez et al. | |
| 8,610,224 B2 | 12/2013 | Naito et al. | |
| 8,905,293 B2 | 12/2014 | Liu et al. | |
| 2003/0067014 A1* | 4/2003 | Tsuruta | H01L 21/76208 257/200 |
| 2009/0191660 A1 | 7/2009 | Christenson et al. | |
| 2012/0205653 A1 | 8/2012 | Nishikage et al. | |
| 2012/0313235 A1 | 12/2012 | Chu et al. | |
| 2013/0068013 A1 | 3/2013 | Beck et al. | |
| 2015/0344299 A1 | 12/2015 | Chang et al. | |
| 2016/0061679 A1 | 3/2016 | Adams et al. | |
| 2017/0057813 A1 | 3/2017 | Shin et al. | |
| 2018/0282153 A1 | 10/2018 | Heller et al. | |

FOREIGN PATENT DOCUMENTS

| | | |
|---|---|---|
| WO | WO 2018/187486 A1 | 10/2018 |
| WO | WO 2018/187490 A1 | 10/2018 |

OTHER PUBLICATIONS

Evertsson et al., "The thickness of native oxides on aluminum alloys and single crystals," Applied Surface Science, 349: 826-832, (2015).
Gabriel et al. "Lokale Plasma-Behandlung in einem Mask Aligner zur selektiven Veränderung der Oberfläche von Wafern Local plasma treatment in a Mask Aligner for selective wafer surface modification," Mikrosystemtechnik Kongress, pp. P8.24-P8.24, (2009). Abstract in English.
Gabriel et al., "Wafer direct bonding with ambient pressure plasma activation," Microsyst Technol, 12:397-400, (2006).
Heller et al., "Surface Preparation and Eutectic Wafer Bonding," ECS Transactions, 75(9):229-239, (2016).
Jeurgens et al., "Determination of thickness and composition of aluminum-oxide overlayers on aluminum substrates," Applied Surface Science, 144-145:11-15, (1999).
Klages et al., "Surface Technology with Cold Microplasmas," Plasma Processes and Polymers, 4, 208-218, (2007).
McAlister et al., "The Al—Ge (Aluminum-Germanium) system," Bulletin of Alloy Phase Diagrams, 5:341-347, (1984). Errata 6(2):111-113 and 183-184, (1985).
Okamoto, "Al—Ge (Aluminum-Germanium)," Journal of Phase Equilibria, 19(1):86, (1998).
Onsia et al., "A Study of the Influence of Typical Wet Chemical Treatments on the Germanium Wafer Surface," Solid State Phenomena, 103-104:27-30, (2005).
Sood, "Advanced Metal-Eutectic Bonding for High Volume MEMS WLP," IEEE MEMS Bay Area Meeting, 30 pages, (2014).
Sood, et al., "Al—Ge Eutectic Wafer Bonding and Bond Characterization for CMOS Compatible Wafer Packaging," ECS Transactions, 33(4):93-101, (2010).
Zavracky et al., "Patterned Eutectic Bonding with Al/Ge Thin Films for MEMS," SPIE, 2639:46-52, (1995).
WIPO Application No. PCT/US2018/026107, PCT International Search Report and Written Opinion of the International Searching Authority dated Jun. 21, 2018.
U.S. Appl. No. 15/685,879, Notice of Allowance dated Apr. 4, 2018.
U.S. Appl. No. 10/053,360, filed Aug. 21, 2018, Heller.
WIPO Application No. PCT/US2018/026111, PCT International Search Report and Written Opinion of the International Searching Authority dated Aug. 23, 2018.
WIPO Application No. PCT/US2018/046324, PCT International Search Report and Written Opinion of the International Searching Authority dated Sep. 14, 2018.

\* cited by examiner

METHOD FOR MANUFACTURING A MICRO ELECTRO-MECHANICAL SYSTEM

CROSS REFERENCE TO RELATED APPLICATIONS

The present application claims benefit under 35 USC 119(e) of Application Ser. No. 62/481,635, filed Apr. 4, 2017, the contents of which is incorporated herein by reference in its entirety.

FIELD OF THE INVENTION

The present invention relates to MEMS, and more particularly to wafer bonding of MEMS.

BACKGROUND

Micro Electro-Mechanical Systems (MEMS), such as motion sensors, inertial sensors, and movable mirrors, are being widely used. As is well known, a MEMS motion sensor may be, for example, an accelerometer for detecting linear motion, or a gyroscope for detecting rotation and angular velocities.

Advanced planar silicon manufacturing processes have become the main manufacturing techniques in MEMS. Direct bonding of double or triple silicon wafers has been recognized as the most attractive packaging technology. However, integrated and robust wafer bonding involving multiple wafers in manufacturing a MEMS device remains a challenge.

BRIEF SUMMARY OF THE INVENTION

A method of fabricating a semiconductor device, in accordance with one embodiment of the present invention, includes, in part, growing a first layer of oxide on a surface of a first semiconductor substrate, forming a layer of insulating material on the oxide layer, patterning and etching the insulating material and the first oxide layer to form a multitude of oxide-insulator structures and further to expose the surface of the semiconductor substrate, growing a second layer of oxide in the exposed surface of the semiconductor substrate, and removing the second layer of oxide thereby to form a cavity in which the semiconductor device is subsequently formed.

In one embodiment, the method further includes, in part, growing a third layer of oxide on the exposed surface of the cavity, and removing the third layer of oxide thereby to increase the cavity depth. The process of growing oxide in the exposed surface of the cavity and removing this oxide may be repeated until the cavity depth reaches a predefined value. In one embodiment, the method further includes, in part, forming a multitude of bump stops in the cavity.

In some embodiments, the method further includes, in part, forming a layer of oxide on the surface of the semiconductor in the cavity. In some embodiments, the method further includes, in part, placing a top surface of a second semiconductor substrate above the first semiconductor substrate; and bonding the first and second semiconductor wafers so as to seal the cavity between the first and second semiconductor substrates.

In some embodiments, the method further includes, in part, thinning the first semiconductor substrate. In some embodiments, the method further includes, in part, forming a layer of oxide on the outer surfaces of the first and second semiconductor substrate; forming a trench in the first semiconductor substrate above the cavity; and filling the trench with a layer of oxide to form an isolation joint.

In some embodiments, the method further includes, in part, forming a contact opening in the layer of oxide above the cavity. In some embodiments, the method further includes, in part, forming a layer of screen oxide over the contact opening. In some embodiments, the method further includes, in part, implanting dopants in the first semiconductor substrate through the screen oxide. In some embodiments, the method further includes, in part, removing the screen oxide; depositing a first layer of metal in the contact opening and over the oxide layer adjacent the contact opening; and depositing a first passivation layer over a portion of the first layer of metal.

In some embodiments, the method further includes, in part, forming first and second moats in the first semiconductor substrate; and forming a multitude of fingers above the cavity of the first semiconductor substrate. The first and second moats extend partially into the second semiconductor substrate. In some embodiments, the method further includes, in part, forming a first channel metal adjacent the first moat; and forming a second channel metal adjacent the second moat.

In some embodiments, the method further includes, in part, forming a multitude of recesses in a third semiconductor substrate; and kerf cutting the third semiconductor substrate. In some embodiments, the method further includes, in part, forming a first layer metal on the third semiconductor substrate; and patterning the first layer metal. In some embodiments, the method further includes, in part, forming a frit layer over the patterned first metal layer to form first and second frit bonding posts.

In some embodiments, the method further includes, in part, forming a metal getter in at least one of the recesses formed in the third semiconductor substrate. In some embodiments, the method further includes, in part, forming a first contact between the first channel metal and the first frit bonding post; forming a second contact between the second channel metal and the second frit bonding post; and performing a frit bonding process between the first and third semiconductor substrates. In some embodiments, the first, second and third semiconductor substrates are silicon substrates. In some embodiments, the insulating material is silicon nitride. In some embodiments, the metal getter includes Titanium. In some embodiments, a bonding technique other than frit bonding is used to bond the third semiconductor substrate to the assembled first and second substratest. In one embodiment, the semiconductor device is a MEMS devise, such as a gyroscope or an accelerometer.

DETAILED DESCRIPTION OF THE INVENTION

In accordance with one embodiment of the present invention, a MEMS device is formed in a cavity of a semiconductor substrate. To form the cavity, in one embodiment, a multitude of oxide-nitride structures are formed on the semiconductor surface and subsequently patterned and etched to expose the semiconductor surface in one or more predefined areas. Thereafter, one or more local oxidation and etching steps are performed so that a cavity of a pre-selected depth is formed.

In accordance with one embodiment of the present invention, the MEMS device (alternatively referred to herein as sensor) is hermetically sealed in a cavity by applying wafer bonding between the first semiconductor wafer in which the MEMS sensor is fabricated (hereinafter alternatively referred to as device wafer), a second semiconductor wafer (hereinafter alternatively referred to as handle wafer), and a third semiconductor wafer—hereinafter referred to as lid waver. The processing steps for forming the MEMS sensor through triple wafer bonding are described below, in accordance with one exemplary embodiment of the present invention.

Figure 1A:
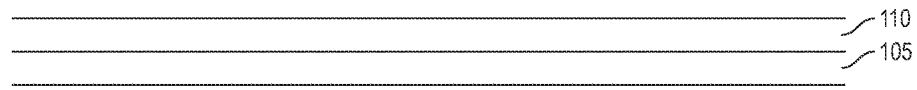
FIG. 1A is a cross-sectional view of a device wafer following the formation of multiple layers thereon, in accordance with one exemplary embodiment of the present invention.

FIG. 1A is a cross-sectional view of a device wafer 100 following the formation of multiple layers thereon, in accordance with one exemplary embodiment of the present invention. Device wafer 100 is shown as including, in part, a pad oxide layer 105 grown using thermal oxidation, and an LPCVD (low pressure chemical vapor deposition) nitride layer 110 formed over pad oxide layer 105.

Figure 1B:
FIG. 1B is a cross-sectional view of the device wafer of FIG. 1A after performing patterning and etching steps, in accordance with one exemplary embodiment of the present invention.
Figure 1C:
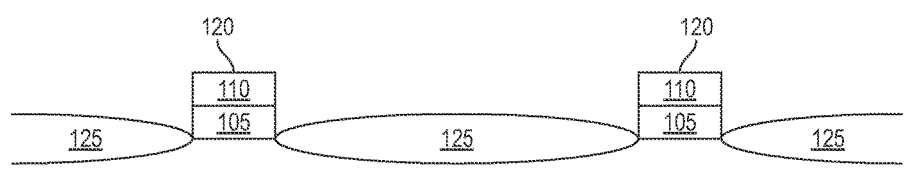
FIG. 1C is a cross-sectional view of the device wafer of FIG. 1B after a thermal oxidation process, in accordance with one exemplary embodiment of the present invention.
Figure 1D:
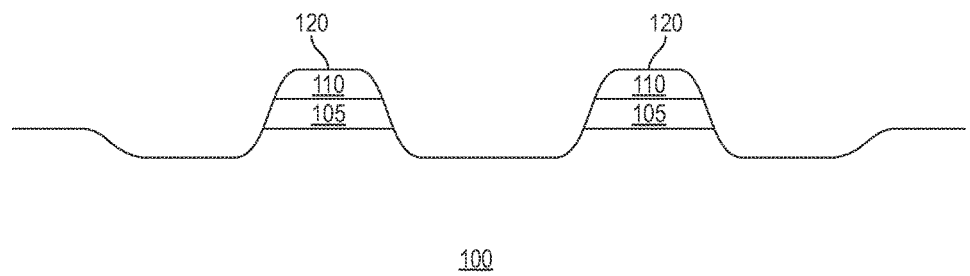
FIG. 1D is a cross-sectional view of the device wafer of FIG. 1C after removing the oxide, in accordance with one exemplary embodiment of the present invention.

Thereafter, oxide layer 105 and LPCVD nitride layer 110 are patterned and etched using conventional patterning and etching steps to form structures 120 each of which includes a layer of oxide 105 and a layer of nitride 110, as shown in FIG. 1B. Thereafter, during a thermal oxidation process, an oxide layer 125 is grown, as shown in FIG. 1C. Oxide layer 125 is then stripped away, using, for example, Hydrofluoric (HF) acid to form the device structure show in FIG. 1D.

Figure 1E:
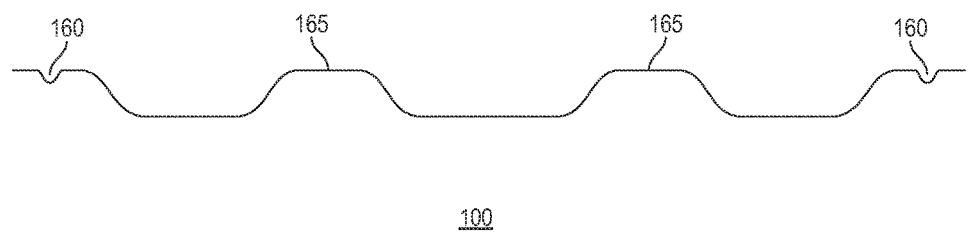
FIG. 1E is a cross-sectional view of the device wafer of FIG. 1C after removing the oxide and Nitride layers, in accordance with one exemplary embodiment of the present invention.

Next, Nitride layer 110 is stripped away using, for example, hot Phosphoric etch, and pad oxide layer 105 is removed using HF acid to form the device structure shown in FIG. 1E. Due to the above-described processing steps, silicon wafer 100 shown in FIG. 1E includes silicon bump stops 165, in accordance with one aspect of the present invention. In one embodiment, bump stops 165 may have a thickness of 1.1 µm. Silicon wafer 100 is also shown as including a number of alignment marks 160 that may be formed using the same patterning process and etching processes described above. In one embodiment, bump stops 165 are used to control and limit the movement of the MEMS sensors.

Figure 1F:
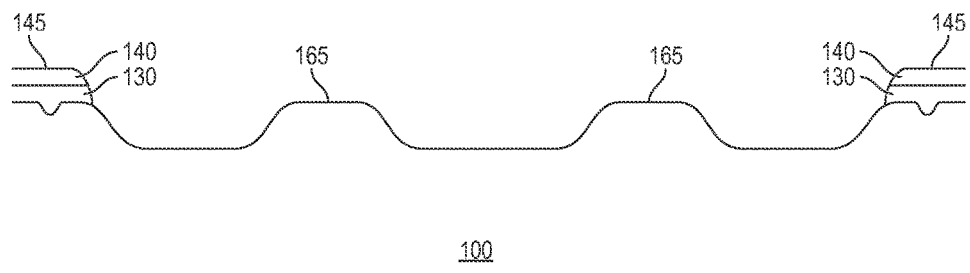
FIG. 1F is a cross-sectional view of the device wafer of FIG. 1E after formation and patterning of oxide and nitride layer thereon, in accordance with one exemplary embodiment of the present invention.

Thereafter, a pad oxide layer is grown on the device of FIG. 1E, and an LPCV layer is deposited on the grown pad oxide layer. The pad oxide layer and LPCVD nitride layers are patterned and etched using conventional patterning and etching steps to form structure 145, as shown in FIG. 1F. In one embodiment, the nitride layer is etched using fluorine based reactive ion etch (RIE). Each structure 145 includes a pad oxide layer 130 and an LPCV nitride layer 140.

Figure 1G:
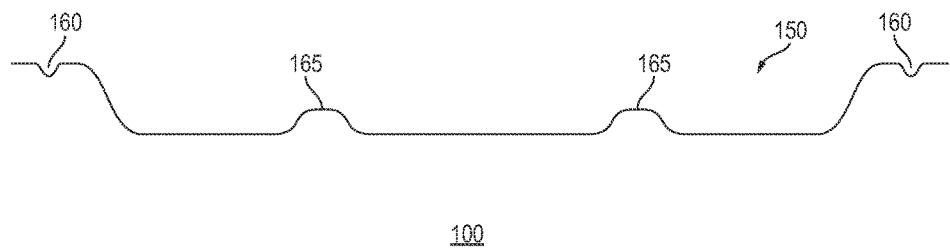
FIG. 1G is a cross-sectional view of the device wafer of FIG. 1F after thermal oxidation followed by removal of oxide and nitride, in accordance with one exemplary embodiment of the present invention.

Thereafter, the device structure of FIG. 1F undergoes a thermal oxidation process (not shown), subsequent to which the thermally grown oxide, LPCVD nitride 140 and pad oxide 130 are removed so as to form a relatively deep cavity 150 in which bump stops 165 are disposed, as shown in FIG. 1G. In one embodiment, cavity 150 has a depth of 2.5 µm.

Figure 2A:
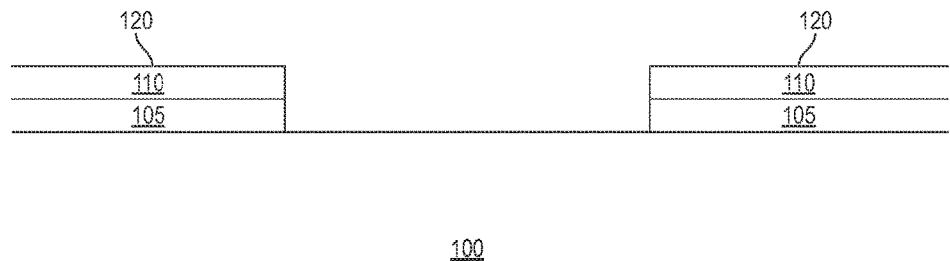
FIG. 2A is a cross-sectional view of the device wafer of FIG. 1A after performing patterning and etching steps, in accordance with another exemplary embodiment of the present invention.
Figure 2B:
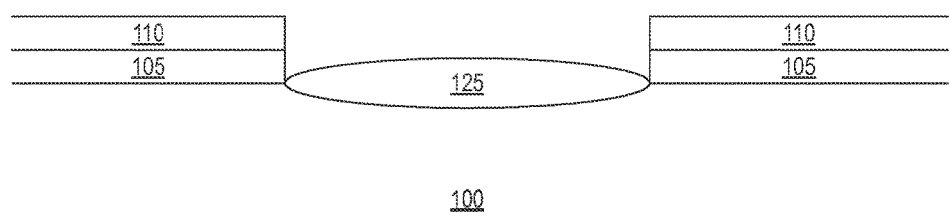
FIG. 2B is a cross-sectional view of the device wafer of FIG. 2A after a thermal oxidation process, in accordance with one exemplary embodiment of the present invention.
Figure 2C:
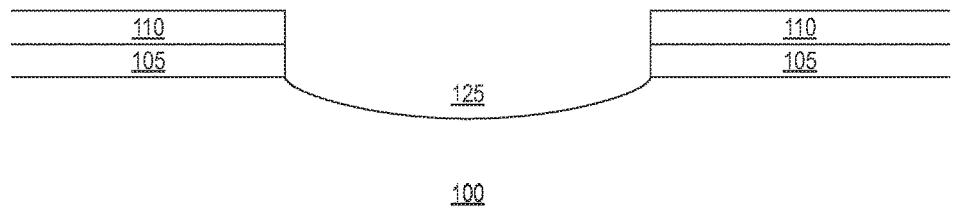
FIG. 2C is a cross-sectional view of the device wafer of FIG. 2B after removing the grown oxide, in accordance with one exemplary embodiment of the present invention.

In accordance with some embodiments of the present, no bump stop is formed in the cavity, as described further below. In such embodiments, oxide layer 105 and LPCVD nitride layer 110, as shown in FIG. 1A are patterned and etched using conventional patterning and etching steps to form a multitude of structures 120 each of which includes a layer of oxide 105 and a layer of nitride 110, as shown in FIG. 2A. Thereafter, during a thermal oxidation process, an oxide layer 125 is grown, as shown in FIG. 2B. Oxide layer 125 is then stripped away, using, for example, Hydrofluoric (HF) acid to form cavity 150 as shown in FIG. 2C. Although not shown, it is understood that the process of growing local oxide and etching the locally grown oxide may be repeated a number of times until cavity 150 reaches the desired depth. The following description of the present invention is made in reference to a cavity that includes bump stops, as shown in FIG. 1E. It is understood, however, that the embodiments of the present invention equally apply to cavities which do not include bump stops. Furthermore, although not shown in details in the drawings, it is understood that the semiconductor MEMS device, such as an accelerometer, in accordance with embodiments of the present invention, is formed in such a cavity.

Figure 3:
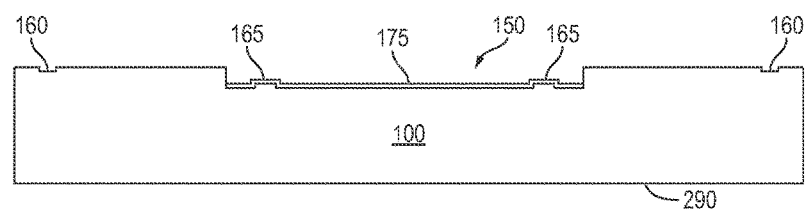
FIG. 3 is a cross-sectional view of the device wafer of FIG. 1G after a layer of oxide is formed in the device wafer cavity, in accordance with one exemplary embodiment of the present invention.

Thereafter, a layer 175 of (tetraethoxysilane) TEOS oxide is deposited and patterned in cavity 150 to form the device structure shown in FIG. 3. In one embodiment, the TEOS oxide layer may have a thickness of 0.2 µm. In another exemplary embodiment (not shown), a layer of Titanium which may have a thickness of e.g., 50 nm, may be deposited over TEOS oxide layer 175 prior to patterning and etching of the TEOS. Because titanium reflects infrared light, such a titanium layer may be used to monitor the recess depth or device layer thickness during subsequent processing stages.

Figure 4:
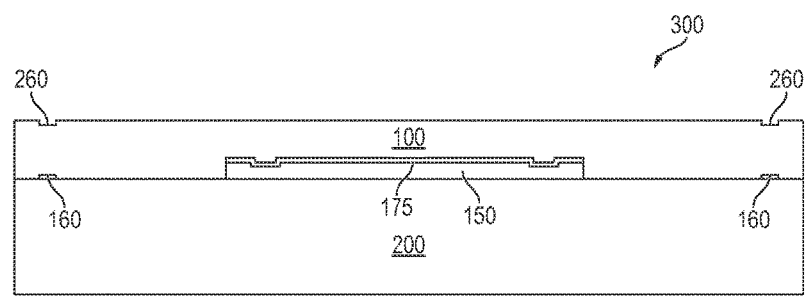
FIG. 4 is a cross-sectional view of the device wafer of FIG. 3 after it is bonded with a second semiconductor wafer to form a device-handle wafer assembly, in accordance with one exemplary embodiment of the present invention.

Next, both device wafer 100, shown in FIG. 3 as well as the handle wafer undergo conventional RCA-1 and RCA-2 cleaning processes. The handle wafer is also HF cleaned prior to bonding. Next, as shown in FIG. 4, with cavity 150 of device wafer 100 facing the top surface of handle wafer 200, device wafer 100 and handle wafer 200 are directly bonded to one another. Device wafer 100 is then planarized and thinned on its back side 290 using a chemical-mechanical planarization (CMP) process. In one embodiment, subsequent to the CMP process, wafer 100 has a thickness of 25 µm. During an alignment process, alignment marks 160 of device wafer 100 are brought into alignment with alignment marks 260 of handle wafer 200, as is also shown in FIG. 4. Accordingly, the MEMS device formed in cavity 150 is hermetically sealed. The bonded device wafer 100 and handling wafer 200 shown in FIG. 4 are alternatively referred to herein as device-handle wafer assembly 300.

Figure 5A:
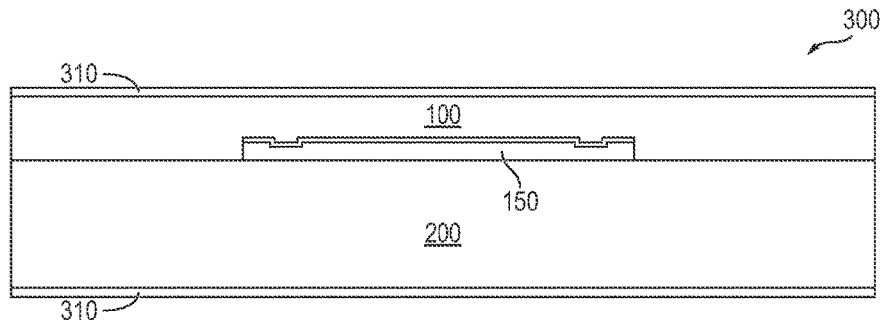
FIG. 5A is a cross-sectional view of the device-handle wafer assembly of FIG. 4 following a thermal oxidation process, in accordance with one exemplary embodiment of the present invention.
Figure 5B:
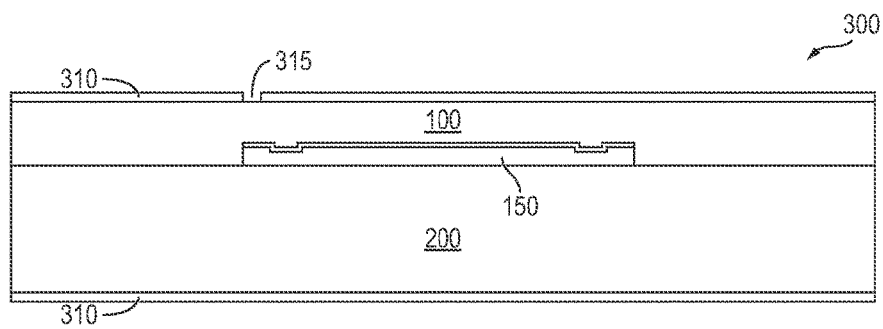
FIG. 5B is a cross-sectional view of the device-handle wafer assembly of FIG. 5A following the formation of an opening in the oxide, in accordance with one exemplary embodiment of the present invention.

Next, as shown in FIG. 5A, during a thermal oxidation process, a layer 310 of thermal oxide is grown on the top and back sides of device-handle wafer assembly 300. Using a patterning and reactive ion etching (RIE) steps, an opening 315 is formed in oxide layer 310 above cavity 150, as shown in FIG. 5B.

Figure 5C:
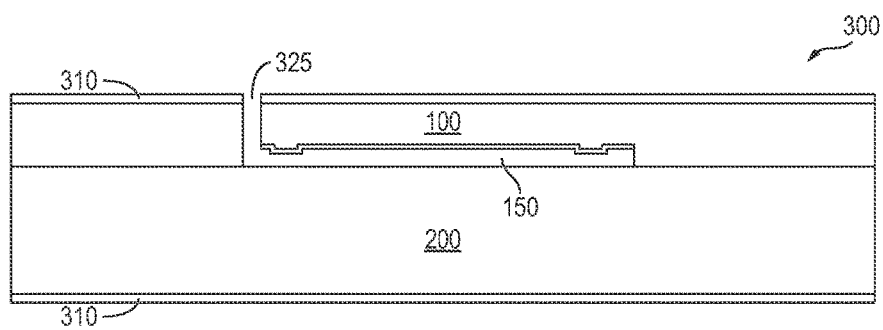
FIG. 5C is a cross-sectional view of the device-handle wafer assembly of FIG. 5B following the formation of a trench, in accordance with one exemplary embodiment of the present invention.
Figure 5D:
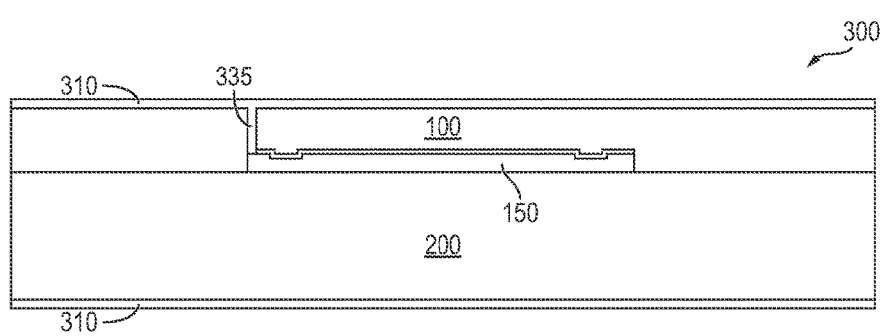
FIG. 5D is a cross-sectional view of the device-handle wafer assembly of FIG. 5C following the filling of the trench, in accordance with one exemplary embodiment of the present invention.

Next, during a DRIE process, a trench 325 is formed in device wafer 100 at opening 315, as shown in FIG. 5C. Trench 325 is then filled with oxide to form isolation joint 335, as shown in FIG. 5D. Subsequently, oxide layers 310 are planarized. In one embodiment, the thickness of oxide layer 310 following the planarization step is about 1 µm. Although device-handle wafer assembly 300 is shown as including one isolation joint 335, it is understood that other embodiments may include more than one isolation joint.

Figure 6A:
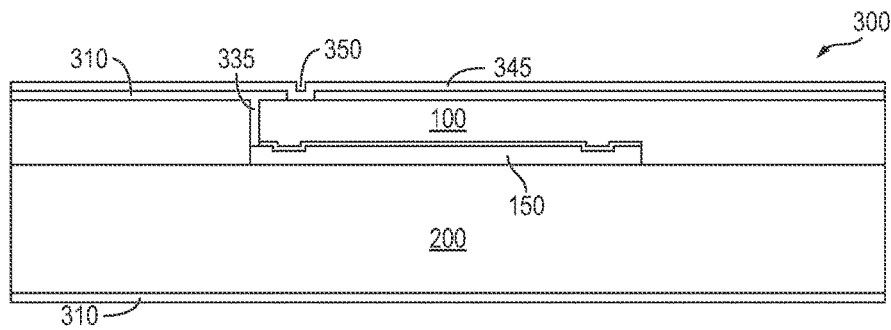
FIG. 6A is a cross-sectional view of the device-handle wafer assembly of FIG. 5D following the formation of an opening in the oxide and deposition of a layer of screen oxide, in accordance with one exemplary embodiment of the present invention.

Next, a contact opening 350 is formed in oxide layer 310 of device wafer 100 (using, for example, fluorine based RIE) and a relatively thin layer of screen oxide 345 is deposited on the resulting structure, as shown in FIG. 6A. The thickness of screen oxide layer 345 is often less than the thickness of oxide layer 310. For example, in one embodiment, when oxide layer has a thickness of 1.1 µm, screen oxide layer 345 may have a thickness of 25 nm. It is understood that the various layers and structures shown the Figures are not drawn to scale. Thereafter, Boron ions are implanted in the silicon through screen oxide layer 345.

Figure 6B:
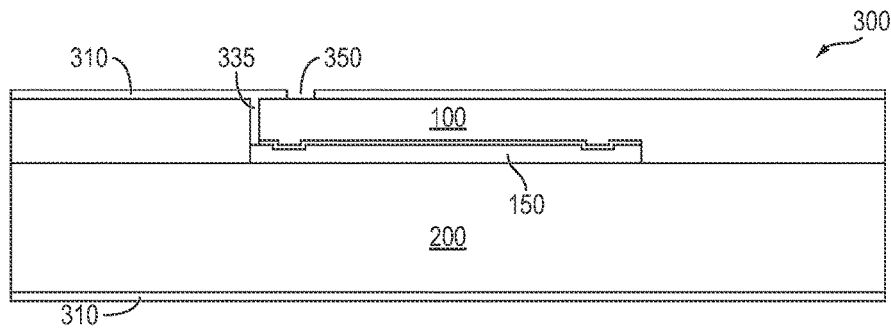
FIG. 6B is a cross-sectional view of the device-handle wafer assembly of FIG. 6A following a dopant implantation step and removal of the screen oxide, in accordance with one exemplary embodiment of the present invention.
Figure 6C:
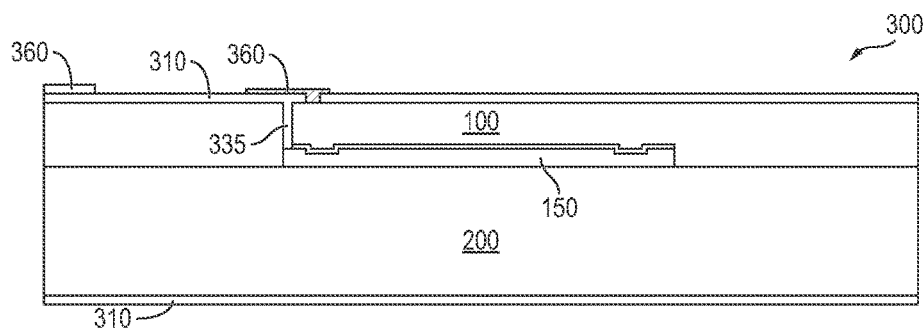
FIG. 6C is a cross-sectional view of the device-handle wafer assembly of FIG. 6B following the deposition and patterning of a first metal layer, in accordance with one exemplary embodiment of the present invention.

Next, a sacrificial oxide etching step is performed using, for example, buffered oxide etching step (BOE), thereby removing any oxide from contact opening 350, as shown in FIG. 6B. Thereafter, a layer of metal, such as Aluminum, is deposited, using for example plasma vapor deposition (PVD) and patterned so as to form metal trace 360 which forms a contact with the Boron-doped silicon region positioned below opening 350, as shown in FIG. 6C. In one embodiment, metal trace 360 has a thickness ranging from 0.1 µm to 0.5 µm.

Figure 7A:
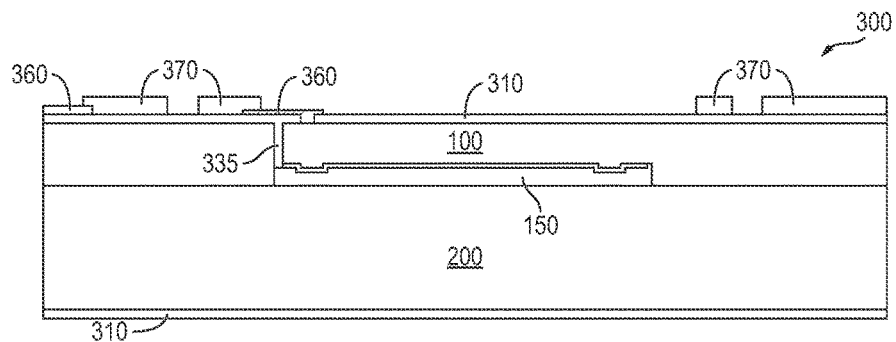
FIG. 7A is a cross-sectional view of the device-handle wafer assembly of FIG. 6C following the deposition and patterning of a first passivation layer, in accordance with one exemplary embodiment of the present invention.
Figure 7B:
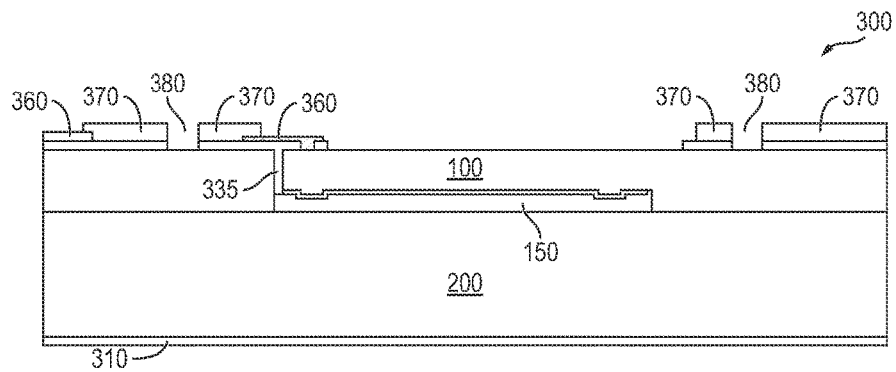
FIG. 7B is a cross-sectional view of the device-handle wafer assembly of FIG. 7A following the removal of portions of the undelaying oxide, in accordance with one exemplary embodiment of the present invention.

Next, a passivation layer, such as TEOS oxide, is deposited on device-wafer handling assembly 300 shown in FIG. 6C. In one embodiment, the TEOS oxide may have a thickness of about 1 micron and deposited using a PECVD process. The passivation layer is subsequently patterned to form passivation structures 370, as shown in FIG. 7A. Next, oxide layer 310 is removed, using, for example a fluorine-based RIE process, from areas not covered by passivation layer 370 thereby to form moat trench openings 380, as shown in FIG. 7B.

Figure 8:
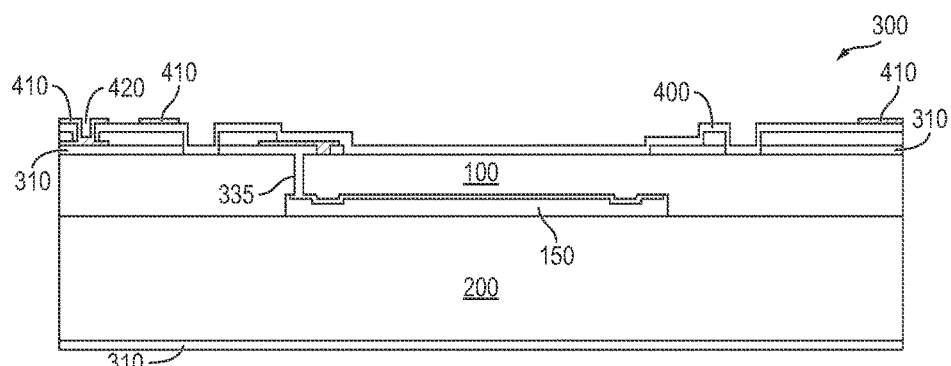
FIG. 8 is a cross-sectional view of the device-handle wafer assembly of FIG. 7B following the deposition and patterning of a second metal layer, in accordance with one exemplary embodiment of the present invention.

To form a second metal layer, a second layer of passivation 400, such as TEOS, is formed on the device structure shown in FIG. 7B and subsequently patterned. In one embodiment, such a passivation layer may have a thickness of 0.5 µm. Thereafter, a second layer of metal 420 is deposited and patterned. In one embodiment, Aluminum is used as a second layer metal having a thickness of e.g., 0.7 µm. FIG. 8 shows the resulting device-handle wafer assembly 300 after the patterning of the second metal layer. As shown in FIG. 8, a portion of second metal layer 410 is seen as forming an electrical contact with a portion of first metal layer 360 through opening 420.

Figure 9A:
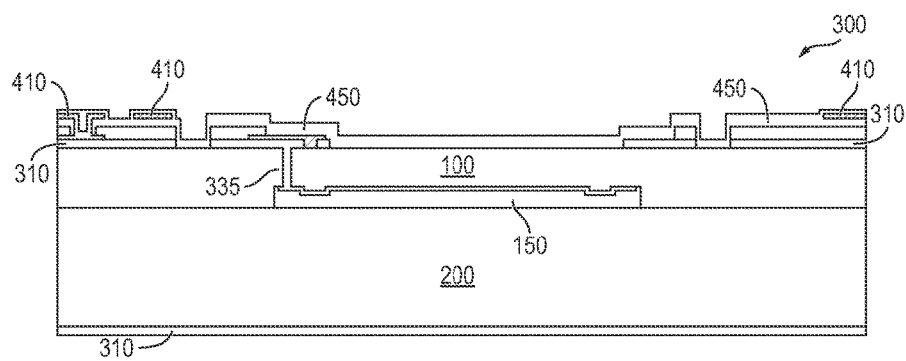
FIG. 9A is a cross-sectional view of the device-handle wafer assembly of FIG. 8 following the deposition of a second passivation layer, in accordance with one exemplary embodiment of the present invention.

Next, as shown in FIG. 9A, another passivation layer 450, such as TEOS, that may have a thickness of e.g. 0.2 µm, is deposited over the device-handle wafer assembly 300 of FIG. 8. A sinterbake process in the temperature range from 375 C to 450 C is used to enhance electrical connection in the contact opening 350 between metal 1 Aluminum and the silicon surface. As it is well known, a rapid thermal anneal process (RTA) may be used to achieve the same effect in the metal-silicon contact.

Figure 9B:
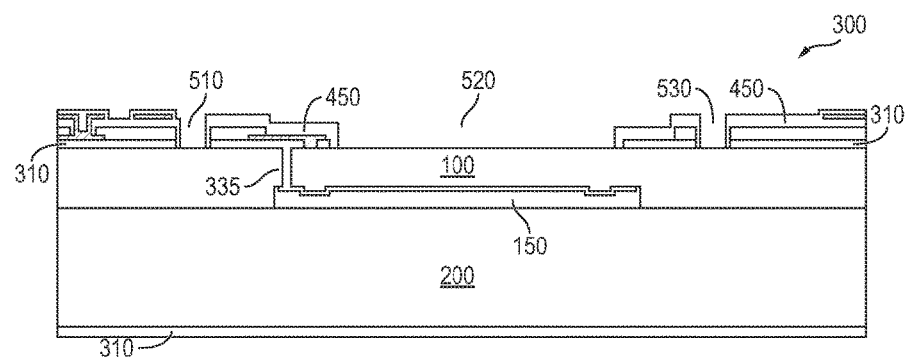
FIG. 9B is a cross-sectional view of the device-handle wafer assembly of FIG. 9A following the patterning of the second passivation layer, in accordance with one exemplary embodiment of the present invention.

Passivation layer 450 is then patterned and etched using, for example, an RIE etching technique to form openings 510, 520, 530, as shown in FIG. 9B, thereby exposing the surface of device wafer 100 at these openings.

Figure 10A:
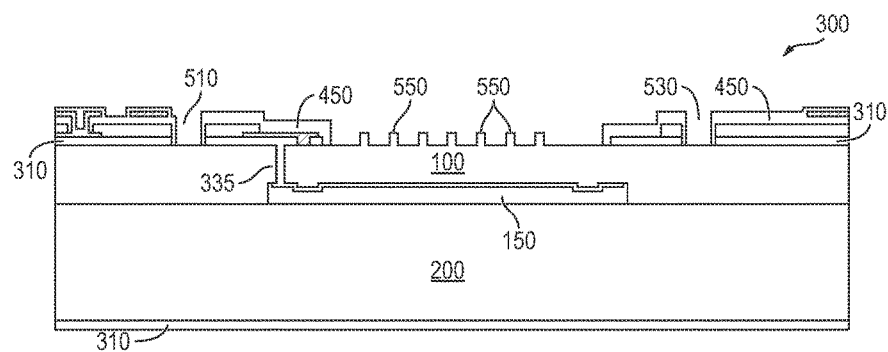
FIG. 10A is a cross-sectional view of the device-handle wafer assembly of FIG. 9B following the deposition and patterning of a photoresist layer, in accordance with one exemplary embodiment of the present invention.

Next, a layer of photoresist is applied and patterned to form a multitude of photoresist structures 550 in opening 520, as shown in FIG. 10A. Thereafter, using, for example an RIE etching process, oxide layer 450 as well as oxide layer 310 disposed on the bottom surface of handle wafer 200, as well as any residual oxide remaining on the exposed surface are removed. Thereafter, using a DRIE etching process, silicon exposed in opening 520 as well as the silicon exposed in openings 510 and 530 are etched. Thereafter, photoresist 550 is removed and a stringer etch step is performed to etch any silicon residuals that may be left on the isolation joint sidewalls.

Figure 10B:
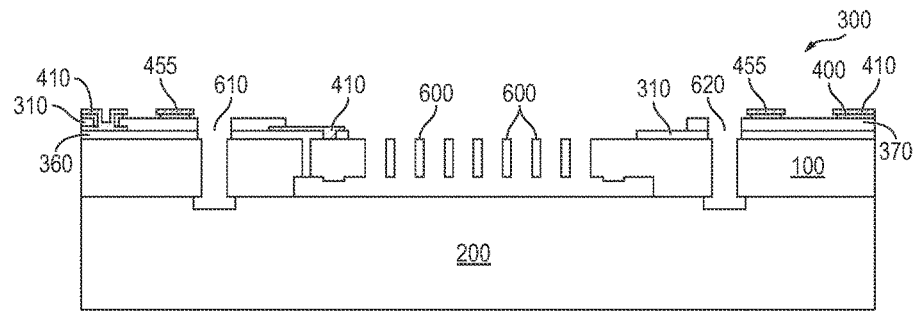
FIG. 10B is a cross-sectional view of the device-handle wafer assembly of FIG. 10A following a number of etching steps, in accordance with one exemplary embodiment of the present invention.

Next, a vapor HF etch step is performed to remove oxide layer 175 in cavity 150, thereby forming the device-handle wafer assembly 300 shown in FIG. 10B. As is seen, device-handle wafer assembly 300 shown in FIG. 10B includes, in part, moats 610 and 620 that extend into handling wafer 200 as well as a multitude of silicon fingers 600 adapted to provide electrical isolation between various regions of the MEMS sensor. Silicon fingers 600 may also be used for driving the MEMS sensors, not shown in the drawings. Metal 2 layer structures 455 positioned adjacent moats 610 are alternatively referred to herein as channel metals.

Figure 11:
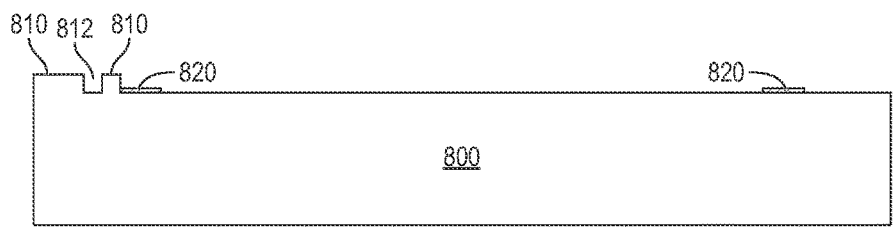
FIG. 11 is a cross-sectional view of a lid wafer after it has been processed to include a number of structures thereon, in accordance with one exemplary embodiment of the present invention.
Figure 12:
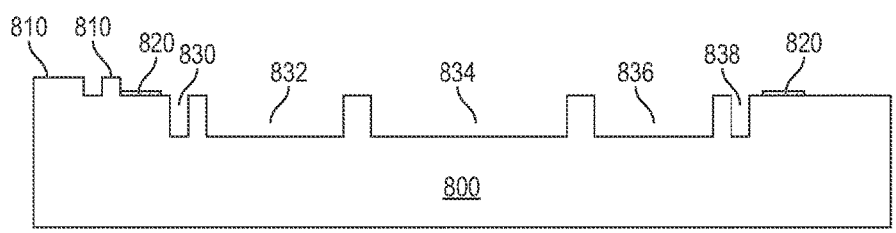
FIG. 12 is a cross-sectional view of the lid wafer of FIG. 11 after it has been processed to include a number of recesses, in accordance with one exemplary embodiment of the present invention.

As described above, in accordance with embodiments of the present invention, a third wafer, herein alternatively referred as a lid wafer is used to bond with the device-handle wafer assembly 300 to seal the MEMS device, as described further below. FIG. 11 is a cross-sectional view of lid wafer 800 after it has been processed to include TEOS structures 810 and first metal layer structures 820, in accordance with one exemplary embodiment of the present invention. TEOS structures 810 define an opening 815 on the wafer backside for later removal of the lid wafer silicon portion above the wire bond pads 410, in order to perform subsequent Kerf cutting, as described further below. In one embodiment, TEOS structures 810 may have a thickness of 0.6 µm and are patterned using RIE etching technique. In one embodiment, first metal layer structures 820 may be Aluminum structures having a thickness of 0.7 µm and patterned using spray etching technique.

Using photoresist coating and etching steps, as shown and described above with respect to FIGS. 10A and 10B, lid wafer 800 is etched to form a multitude of recesses 830, 832, 834, 836, and 838 therein. In one embodiment, the recesses have a depth in the range of 6-7 µm. Next lid wafer 800 is kerf cut to a depth of, for example, 80 µm, after which the TEOS structures 810 are removed. In another embodiment dicing saw with a reflective infra-red (IR) lighting and camera setup is used to perform the kerf cut on the lid wafer backside so to remove the silicon from areas above the wirebond pads post bond of the lid wafer.

Figure 13:
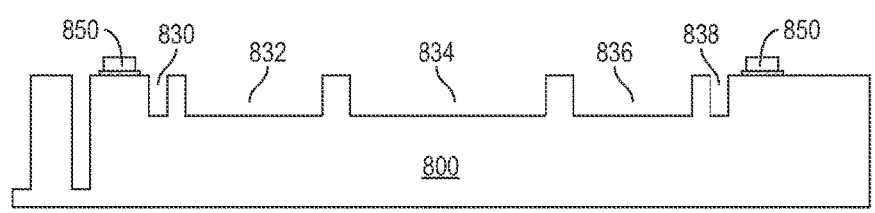
FIG. 13 is a cross-sectional view of the lid wafer of FIG. 12 after formation of a number of bonding posts thereon, in accordance with one exemplary embodiment of the present invention.

To prepare lid wafer 800 for frit bonding with device-handle wafer assembly shown in FIG. 10B, in accordance with one embodiment, a layer of frit 850 is deposited on the surface of metal one layer 810, as shown in FIG. 13. In one embodiment, glass frit screen printing and glazing are used to form and condition the surface of frit 850, also referred to herein as bonding posts. In yet other embodiments, techniques other than frit bonding, may be used to bond the lid wafer with the device-handle wafer assembly.

Figure 14:
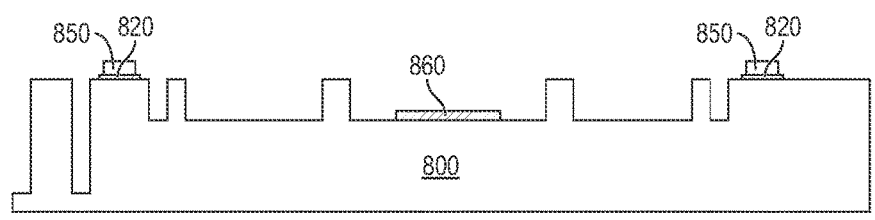
FIG. 14 is a cross-sectional view of the lid wafer of FIG. 13 after formation of a metal getter in one of the recesses, in accordance with one exemplary embodiment of the present invention.

A layer of metal, such as Titanium or gold, is also deposited and patterned on the bottom surface of one of the recesses, such as recess 834, to form a metal getter 860, as shown in FIG. 14. Metal getter 860 is adapted to absorb nitrogen, oxygen or other reactive gasses without interacting with inert gases such as Argon that are used to set the pressure within the recesses during bonding.

Figure 15:
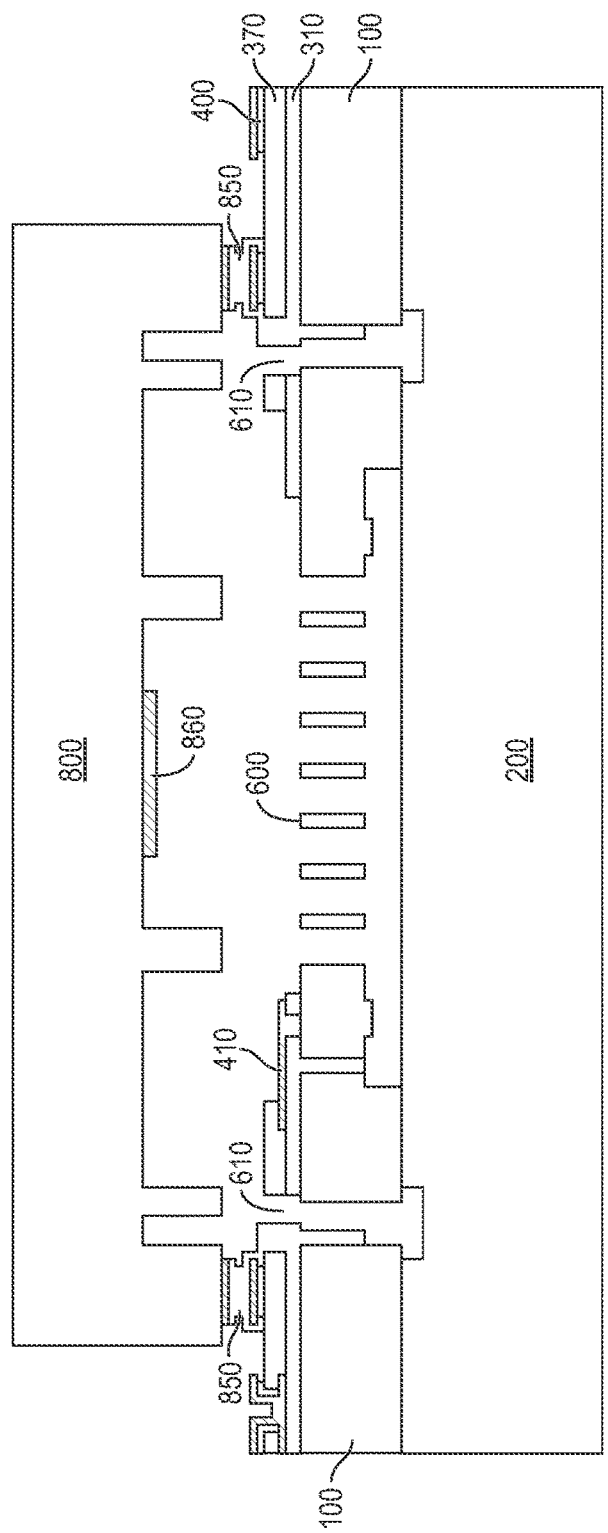
FIG. 15 is a cross-sectional view of the lid wafer of FIG. 14 after it has been frit bonded with device-handle wafer assembly of FIG. 10B, in accordance with one exemplary embodiment of the present invention.

Next, the surface of the device-handle wafer assembly 300 shown in FIG. 10B is brought into contact with the surface of the lid wafer 800 so as to position frit bonding posts 850 in contact with channel metals 455, as shown in FIG. 15. Thereafter, during a frit bonding process, the required heat and pressure are applied. Frit 850 may be compressed so as to have a thickness of, e.g., 5 microns. Any excess molten glass is squeezed into the moats 610 and 620 during the fritting process to form a leveled packaging.

The above embodiments of the present invention are illustrative and not limitative. Embodiments of the present invention are not limited by the type of MEMS device. Embodiments of the present invention are not limited by the type of deposition, patterning, etching, and other semiconductor processing steps required to form the various layers and structures described herein. Embodiments of the present invention are not limited to any specific thicknesses of the layers described herein. Embodiments of the present invention are not limited to the materials/layers described above. Accordingly, it is understood that other semiconductor materials may be present between the various layers described above. Other additions, subtractions or modifications are obvious in view of the present disclosure and are intended to fall within the scope of the appended claims.

What is claimed is:

1. A method of fabricating a semiconductor device, the method comprising:
   growing a first layer of oxide on a surface of a first semiconductor substrate;
   forming a layer of insulating material on the oxide layer;
   patterning and etching the insulating material and the first oxide layer to form a plurality of oxide-insulator structures, said etching exposing the surface of the semiconductor substrate;
   growing a second layer of oxide in the exposed surface of the semiconductor substrate; and removing the second layer of oxide thereby to form a cavity in which the semiconductor device is formed.

2. The method of claim 1 further comprising:
growing a third layer of oxide on the exposed surface of the cavity; and
removing the third layer of oxide to increase the cavity depth.

3. The method of claim 2 further comprising:
repeating the growing of the third layer of oxide and removing the third layer of oxide until the cavity depth reaches a predefined value.

4. The method of claim 1 father comprising:
forming a plurality of bump stops in the cavity.

5. The method of claim 1 further comprising:
forming an oxide layer in the cavity.

6. The method of claim 1 further comprising:
placing an upper surface of a second semiconductor substrate above the first semiconductor substrate; and
bonding the first and second semiconductor substrates so as to seal the cavity between the first and second semiconductor substrates.

7. The method of claim 6 further comprising:
thinning the first semiconductor substrate.

8. The method of claim 7 further comprising:
forming a fourth layer of oxide on the outer surfaces of the first and second semiconductor substrates;
forming a trench in the first semiconductor substrate above the cavity; and
filling the trench with a fifth layer of oxide to form an isolation joint.

9. The method of claim 8 further comprising:
forming a contact opening in the fourth layer of oxide above the cavity.

10. The method of claim 9 further comprising:
forming a layer of screen oxide over the contact opening.

11. The method of claim 10 further comprising:
implanting dopants in the first semiconductor substrate through the screen oxide.

12. The method of claim 11 further comprising:
removing the screen oxide;
depositing a first layer of metal in the contact opening and over the fourth oxide layer adjacent the contact opening; and
depositing a first passivation layer over a portion of the first layer of metal.

13. The method of claim 12 further comprising:
forming first and second moats in the first semiconductor substrate, said first and second moats extending partially into the second semiconductor substrate; and
forming a plurality of fingers in the cavity of the first semiconductor substrate.

14. The method of claim 13 further comprising:
forming a first channel metal adjacent said first moat; and
forming a second channel metal adjacent said second moat.

15. The method of claim 14 further comprising:
forming a plurality of recesses in a third semiconductor substrate; and
kerf cutting the third semiconductor substrate.

16. The method of claim 15 further comprising:
forming a first layer metal on the third semiconductor substrate; and
patterning the first layer metal.

17. The method of claim 16 further comprising:
forming an oxide layer over the patterned first metal layer to form first and second bonding posts.

18. The method of claim 17 further comprising:
forming a metal getter in at least one of the recesses formed in the third semiconductor substrate.

19. The method of claim 18 further comprising:
forming a first contact between the first channel metal and the first bonding post;
forming a second contact between the second channel metal and the second bonding post; and
bonding the first semiconductor substrate to the second semiconductor substrate.

20. The method of claim 19 wherein said first, second and third semiconductor substrates are silicon substrates.

21. The method of claim 20 wherein said insulating material is silicon nitride.

22. The method of claim 20 wherein said metal getter includes Titanium.

23. The method of claim 19 further comprising:
frit bonding the first semiconductor substrate to the second semiconductor substrate.

24. The method of claim 1 wherein said semiconductor device is a MEMS device.

* * * * *